US012007434B2

(12) United States Patent
Fawcett

(10) Patent No.: US 12,007,434 B2
(45) Date of Patent: Jun. 11, 2024

(54) BURN-IN BOARD SEATING

(71) Applicant: Micro Control Company, Fridley, MN (US)

(72) Inventor: Aidan Michael Fawcett, Minneapolis, MN (US)

(73) Assignee: MICRO CONTROL COMPANY, Fridley, MN (US)

(*) Notice: Subject to any disclaimer, the term of this patent is extended or adjusted under 35 U.S.C. 154(b) by 489 days.

(21) Appl. No.: 17/507,242

(22) Filed: Oct. 21, 2021

(65) Prior Publication Data

US 2022/0120808 A1 Apr. 21, 2022

Related U.S. Application Data

(60) Provisional application No. 63/094,440, filed on Oct. 21, 2020.

(51) Int. Cl.
*G01R 31/28* (2006.01)
*G05B 19/418* (2006.01)

(52) U.S. Cl.
CPC ..... *G01R 31/2868* (2013.01); *G01R 31/2862* (2013.01); *G01R 31/2863* (2013.01); *G01R 31/2865* (2013.01); *G05B 19/41805* (2013.01)

(58) Field of Classification Search
CPC . G06F 11/3089; G01R 19/00; G01R 31/2863; G01R 31/2862; G01R 31/2865;

(Continued)

(56) References Cited

U.S. PATENT DOCUMENTS 4,683,424 A * 7/1987 Cutright ............ G01R 31/2817
361/796
5,195,827 A 3/1993 Audy et al.
(Continued)

FOREIGN PATENT DOCUMENTS

TW 201428247 7/2014
TW 201501099 1/2015
(Continued)

OTHER PUBLICATIONS

International Search Report and Written Opinion of PCT/US2015/014562, mailed Apr. 23, 2015.
(Continued)

*Primary Examiner* — Vinh P Nguyen
(74) *Attorney, Agent, or Firm* — Brian D. Kaul; Westman, Champlin & Koehler, P.A.

(57) ABSTRACT

A semiconductor burn-in oven includes a housing having a chamber, a heating device, testing circuitry having circuit connectors, and a seating assembly. The seating assembly includes a main frame, a main frame actuator connected to the main frame, a plurality of hook members connected to the main frame, and a hook driver. The main frame actuator is configured to drive movement of the main frame along a first axis between an extended position and a retracted position. The hook driver is configured to pivot each of the hook members about a pivot axis between a receiving position and a latching position. Board connectors of burn-in boards supported within the chamber are driven to seat with the circuit connectors when the burn-in boards are latched by the hook members in their latching position and the main frame is moved from the extended position to the retracted position.

20 Claims, 14 Drawing Sheets

(58) Field of Classification Search
CPC ............ G01R 31/2868; G01R 31/2867; G01R 31/287; G01R 31/2874; G01R 1/0458; H05B 3/008; H05K 1/11; H05K 5/0217; H05K 2201/2009; H05K 7/1053; H05K 1/18; G05B 19/41805
See application file for complete search history.

(56) References Cited

U.S. PATENT DOCUMENTS

| | | | |
|---|---|---|---|
| 5,359,285 A | 10/1994 | Hashinaga et al. | |
| 5,582,235 A | 12/1996 | Hamilton et al. | |
| 6,166,555 A * | 12/2000 | Lillja | G01R 31/2862 324/763.01 |
| 6,169,442 B1 | 1/2001 | Meehan et al. | |
| 6,332,710 B1 | 12/2001 | Aslan et al. | |
| 6,554,469 B1 | 4/2003 | Thomson et al. | |
| 7,150,561 B1 | 12/2006 | D' Aquino et al. | |
| 7,252,432 B1 | 8/2007 | Henderson et al. | |
| 7,288,951 B1 | 10/2007 | Bailey et al. | |
| 7,461,974 B1 | 12/2008 | Aslan et al. | |
| 7,650,762 B2 | 1/2010 | Hamilton et al. | |
| 7,826,998 B1 | 11/2010 | Taheri et al. | |
| 10,126,177 B2 * | 11/2018 | Olson | G01R 31/2874 |
| 11,680,980 B2 * | 6/2023 | Tremmel | G01R 31/2862 324/750.05 |
| 2005/0036352 A1 | 2/2005 | Norris et al. | |
| 2006/0049843 A1 | 3/2006 | Jenkins et al. | |
| 2006/0063285 A1 | 3/2006 | Miller | |
| 2006/0265174 A1 | 11/2006 | Doyle et al. | |

FOREIGN PATENT DOCUMENTS

| | | |
|---|---|---|
| TW | 201539003 | 10/2015 |
| WO | 2015123078 A1 | 8/2015 |

OTHER PUBLICATIONS

ADT7461 ±1° C. Temperature Monitor with Series Resistance Cancellation, May 2012—Rev. 7 © Semiconductor Components Industries, LLC, http://onsemi.com, 20 pages.

Hughes, Ronnie D., "Remote Diodes yield accurate temperature measurements," Jul. 10, 2003, www.edn.com, pp. 59-62.

±1° C. Temperature Sensor with Series-R, η-Factor, and Automatic Beta Compensation, Texas Instruments Incorporated, Copyright © 2009-2013, 42 pages.

English translation of Office Action including a Search Report for Taiwan Patent Application No. 104104589, dated Jun. 27, 2018.

* cited by examiner

BURN-IN BOARD SEATING

CROSS-REFERENCE TO RELATED APPLICATION

The present application is based on and claims the benefit of U.S. provisional patent application Ser. No. 63/094,440, filed Oct. 21, 2020, the content of which is hereby incorporated by reference in its entirety.

BACKGROUND

Semiconductor devices, such as silicon integrated circuit chips or other semiconductor devices, are subject to early failure during their life cycle. It is desirable to detect and eliminate the devices that are most prone to early failure prior to sending them to market. Additionally, it is desirable to identify the components of the semiconductor devices that cause the early failures so that they may be improved. Thus, producers of these devices have found it cost-effective to utilize burn-in systems to rigorously temperature stress the semiconductor devices while simultaneously powering them in order to test the reliability of the devices.

Burn-in test systems typically include a burn-in oven having a testing chamber that houses a plurality of burn-in boards, each of which supports a number of semiconductor devices to be tested. The burn-in test system powers the devices under test and exposes the devices to heat stress over an extended period of time. During burn-in temperature stressing of the chips, heat exchange systems are employed to maintain the chips within a desired temperature range to prevent overheating of the chips, which can damage properly functioning chips. A determination of the reliability of the devices can be made based on the actual semiconductor die temperature during the test. Examples of such systems are described in U.S. Pat. Nos. 7,288,951 and 7,650,762, which issued to Micro Control Company and are incorporated herein by reference in their entirety.

SUMMARY

Embodiments of the present disclosure relate to semiconductor burn-in systems and semiconductor burn-in ovens that perform tests on semiconductor devices. Some embodiments are directed to semiconductor burn-in ovens having a seating assembly for establishing electrical connections between semiconductor devices supported on burn-in boards and testing circuitry used to perform tests on the devices. Additional embodiments are directed to methods of receiving burn-in boards within a semiconductor burn-in oven using the seating assembly.

One embodiment of the semiconductor burn-in oven includes a housing having a chamber, a heating device configured to heat the chamber, testing circuitry configured to power semiconductor devices of burn-in boards supported within the chamber through circuit connectors, and a seating assembly. The seating assembly includes a main frame, a main frame actuator connected to the main frame, a plurality of hook members connected to the main frame, and a hook driver. The main frame actuator is configured to drive movement of the main frame along a first axis relative to the circuit connectors and the chamber between an extended position and a retracted position. Each hook member has a pivot axis that is substantially perpendicular to the first axis. The hook driver is configured to pivot each of the hook members about its pivot axis between a receiving position and a latching position. Board connectors of burn-in boards supported within the chamber are driven to seat with the circuit connectors when the burn-in boards are latched by the hook members in their latching position and the main frame is moved from the extended position to the retracted position.

Another embodiment of the semiconductor burn-in oven includes a housing having a chamber, a heating device configured to heat the chamber, testing circuitry configured to power semiconductor devices of burn-in boards supported within the chamber through circuit connectors, and a seating assembly. The seating assembly includes a main frame, a main frame actuator connected to the main frame, a plurality of hook members connected to side members of the main frame, a hook actuator connected to the plurality of hook members, and a hook actuator driver. The main frame actuator is configured to drive movement of the main frame along a first axis relative to the circuit connectors and the chamber between an extended position and a retracted position. Each hook member has a pivot axis that is substantially perpendicular to the first axis. Each hook member includes a first pivotable connection between the hook member and the hook actuator, and a second pivotable connection between the hook member and each side member of the main frame that defines the pivot axis. The hook actuator driver is configured to drive movement of the hook actuator along a second axis that is substantially perpendicular to the first and pivot axes. Each of the hook members pivots about its pivot axis between a receiving position and a latching position in response to the movement of the hook actuator along the second axis. Board connectors of burn-in boards supported within the chamber are driven to seat with the circuit connectors when the burn-in boards are latched by the hook members in their latching position and the main frame is moved from the extended position to the retracted position.

Another embodiment is directed to a method of receiving a plurality of burn-in boards within a semiconductor burn-in oven. Here, the burn-in oven includes a housing having a chamber, a heating device configured to heat the chamber, testing circuitry configured to power semiconductor devices of burn-in boards supported within the chamber through circuit connectors, and a seating assembly. The seating assembly includes a main frame, a main frame actuator connected to the main frame, a plurality of hook members connected to the main frame, and a hook driver. The main frame actuator is configured to drive movement of the main frame along a first axis relative to the circuit connectors and the chamber between an extended position and a retracted position. Each hook member has a pivot axis that is substantially perpendicular to the first axis. The hook driver is configured to pivot each of the hook members about its pivot axis between a receiving position and a latching position. In the method, a plurality of burn-in boards are received within the chamber while the hook members are in the receiving position and the main frame is in the extended position. The hook members are moved to the latching position using the hook driver. The main frame is moved to the retracted position using the main frame actuator. The board connectors of the burn-in boards are seated with the circuit connectors in response to moving the main frame, wherein semiconductor devices of the burn-in boards may be powered by the testing circuitry.

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter. The claimed subject matter is not limited to implementations that solve any or all disadvantages noted in the Background.

DETAILED DESCRIPTION OF ILLUSTRATIVE EMBODIMENTS

Figure 1:
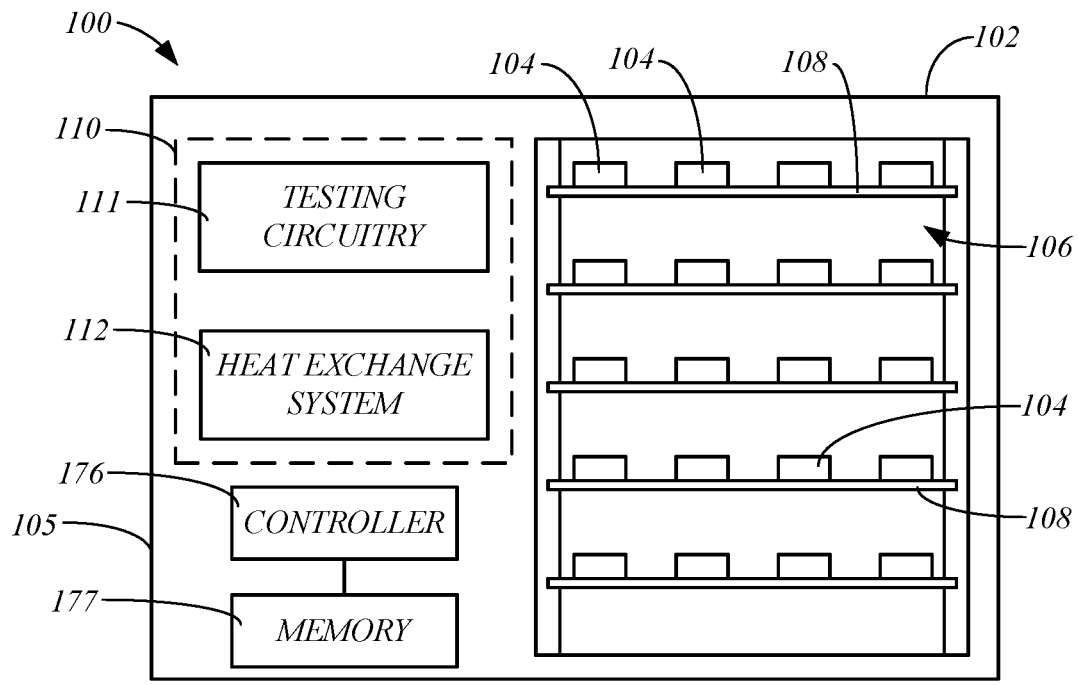
FIG. 1 is a simplified diagram of a burn-in system that includes a semiconductor burn-in oven 102 for testing semiconductor devices, in accordance with embodiments of the present disclosure.

Embodiments of the present disclosure are described more fully hereinafter with reference to the accompanying drawings. Elements that are identified using the same or similar reference characters refer to the same or similar elements. The various embodiments of the present disclosure may, however, be embodied in many different forms and should not be construed as limited to the embodiments set forth herein. Rather, these embodiments are provided so that this disclosure will be thorough and complete, and will fully convey the scope of the present disclosure to those skilled in the art.

Specific details are given in the following description to provide a thorough understanding of the embodiments. However, it is understood by those of ordinary skill in the art that the embodiments may be practiced without these specific details. For example, circuits, systems, networks, processes, frames, supports, connectors, motors, processors, and other components may not be shown, or may be shown in block diagram form in order to not obscure the embodiments in unnecessary detail.

It is appreciated that certain features of the invention, which are, for clarity, described in the context of separate embodiments, may also be provided in combination in a single embodiment. Conversely, various features of the invention, which are, for brevity, described in the context of a single embodiment, may also be provided separately or in any suitable subcombination or as suitable in any other described embodiment of the invention. Certain features described in the context of various embodiments are not to be considered essential features of those embodiments, unless the embodiment is inoperative without those elements.

Embodiments of the present disclosure may refer to one or more controllers, each of which may represent one or more processors that control components to perform one or more functions described herein in response to the execution of instructions, which may be stored local or remote memory. Such memory may comprise any suitable patent subject matter eligible computer readable media or memory such as, for example, hard disks, CD-ROMs, optical storage devices, or magnetic storage devices. Such computer readable media or memory do not include transitory waves or signals In some embodiments, the processors of the controllers are components of one or more computer-based systems. In some embodiments, each controller includes one or more control circuits, microprocessor-based engine control systems, one or more programmable hardware components, such as a field programmable gate array (FPGA), that are used to control components to perform one or more functions described herein.

FIG. 1 is a simplified diagram of an example of a burn-in system 100 for testing semiconductor devices 104, in accordance with embodiments of the present disclosure. The system 100 comprises a burn-in oven 102, which includes a housing 105 having a burn-in chamber 106. The burn-in chamber 106 is configured to receive burn-in boards 108, each of which supports multiple devices 104. The system 100 also includes system electronics 110 for controlling functions performed using the burn-in oven 102, such as testing circuitry 111 and a heat exchange system 112, for example.

Figure 2:
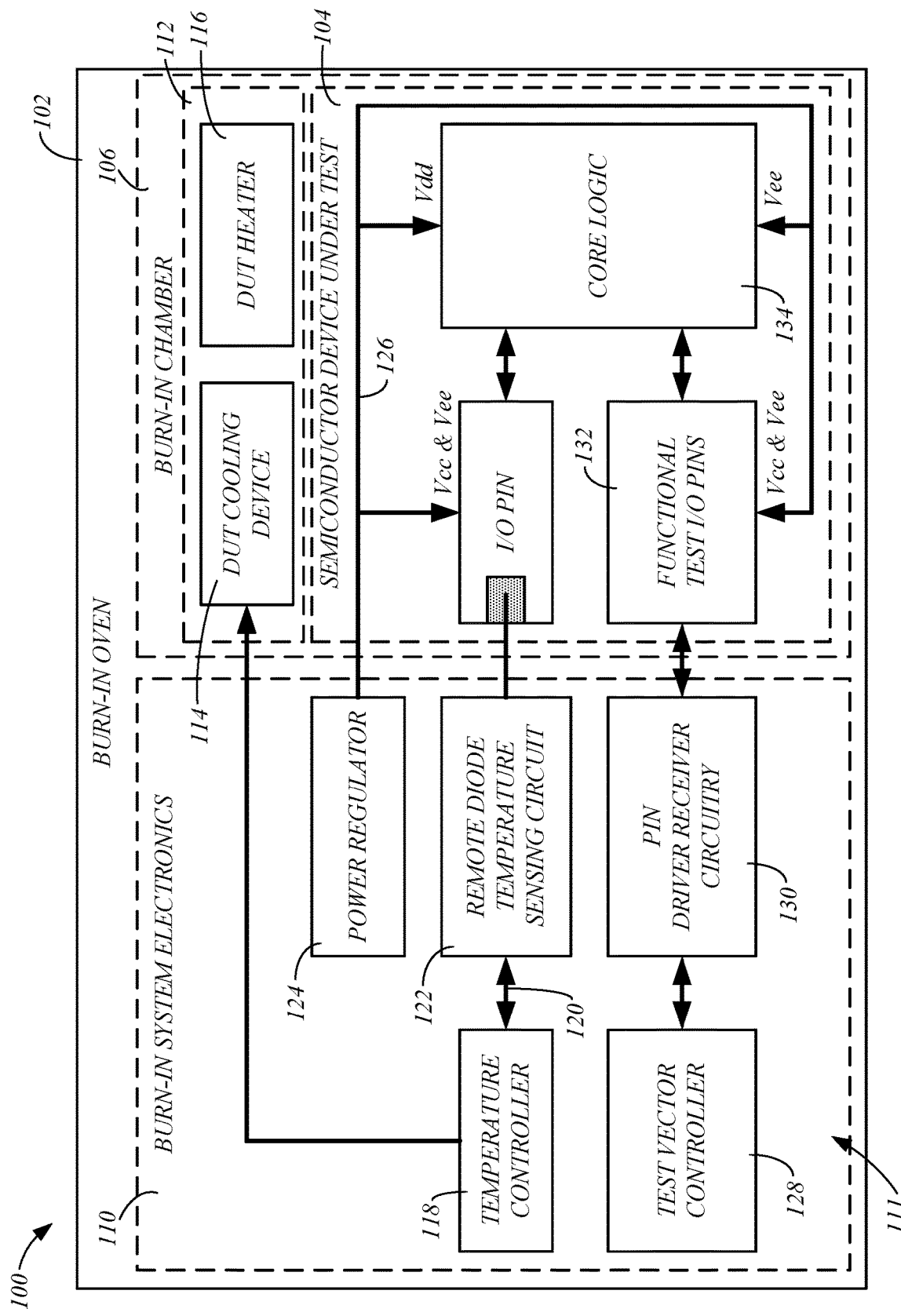
FIG. 2 is a simplified block diagram of an exemplary burn-in system, in accordance with embodiments of the present disclosure.

FIG. 2 is a simplified block diagram of a burn-in system 100 example, in accordance with embodiments of the present disclosure. Many of the depicted elements are conventional for burn-in systems and, thus, a detailed explanation of each element is unnecessary. The burn-in system 100 is configured to power and expose the semiconductor devices 104 under test to heat stress the devices 104 over an extended period of time. As mentioned above, the system 100 may utilize one or more burn-in boards 108 having sockets for supporting a number of semiconductor devices 104 for testing in the chamber 106 of the semiconductor burn-in oven 102. Thus, while only a single device 104 is depicted in FIG. 2, it is understood that embodiments of the invention are applicable to systems that are configured to test multiple devices 104.

In some embodiments, the heat exchange system 112 operates to maintain the devices 104 under test within a desired temperature range to prevent overheating the devices 104, which can potentially damage properly functioning devices. In some embodiments, the heat exchange system 112 includes a cooling device 114 and/or a heating device 116. A temperature controller 118 may be used to control the heat exchange system 112 to maintain the devices 104 within the desired temperature range in response to a temperature output signal 120 from a temperature sensing circuit 122 that senses or obtains a temperature of the device 104, such as through a pin of the device 104, for example. Other techniques for sensing the temperature of the device 104 under test may be used.

The testing circuitry 111 of the system electronics 110 may comprise one or more power stages that include one or more power regulators 124 that are used to supply a desired power 126 to a testing stage of the burn-in system 100. The testing stage handles the application of the power 126 supplied from the power regulators 124 to the semiconductor devices 104. Thus, the power regulators 124 may supply desired voltages to the device 104 under test through conventional power pins (i.e., not I/O pins), such as a positive supply voltage Vcc, a negative supply voltage Vee (e.g., ground), a logic positive supply voltage Vdd, or other voltage, for example.

The testing circuitry 111 may also include electronics, such as a test vector controller 128 and pin driver receiver circuitry 130, that are used to perform various functional tests on the device 104 through a set of functional test I/O pins 132. The functional tests determine whether components of the semiconductor device 104, such as core logic 134 and/or other components, are operating properly during the testing period.

Figure 3:
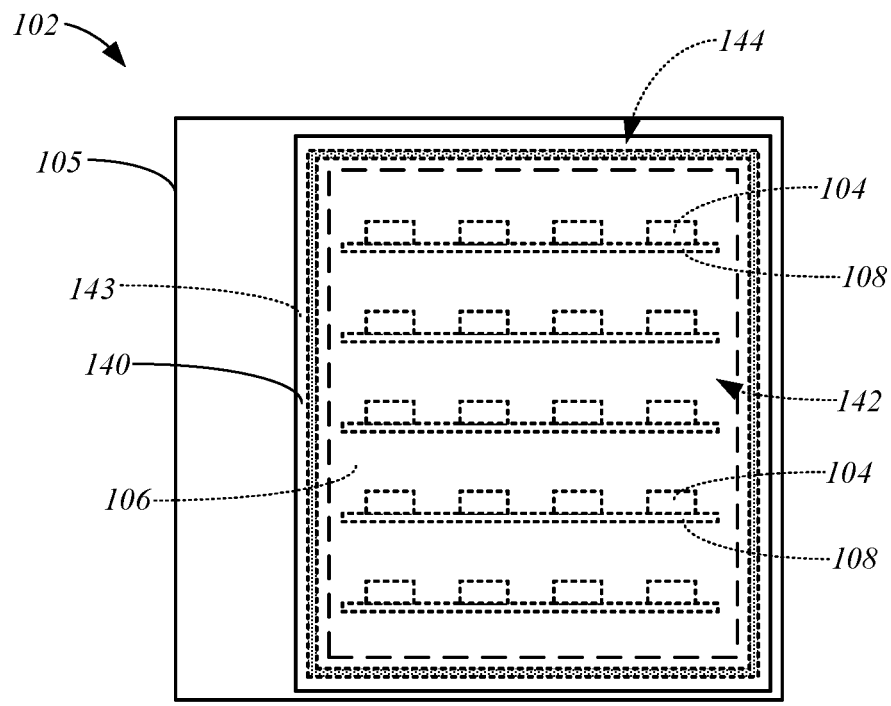
FIG. 3 is a simplified front view of a semiconductor burn-in oven, in accordance with embodiments of the present disclosure.

The semiconductor burn-in oven 102 may include features for sealing the burn-in chamber 106 during testing of semiconductor devices. In some embodiments, the semiconductor burn-in oven 102 includes a door 140 that is configured to cover an opening 142 to the burn-in chamber 106 that is surrounded by a front face 143 of the housing, as shown in FIG. 3, which is a simplified front view of a burn-in oven 102, in accordance with embodiments of the present disclosure. A sealing mechanism 144 may provide a seal around the opening 142 between the front face 143 of the housing 105 and an interior side or wall of the door 140. The seal formed by the sealing mechanism 144 isolates the environment within the chamber 106 from the environment surrounding the oven 102. This allows the oven 102 to efficiently control the temperature within the chamber 106, and accurately control the testing of the devices 104.

Figure 4:
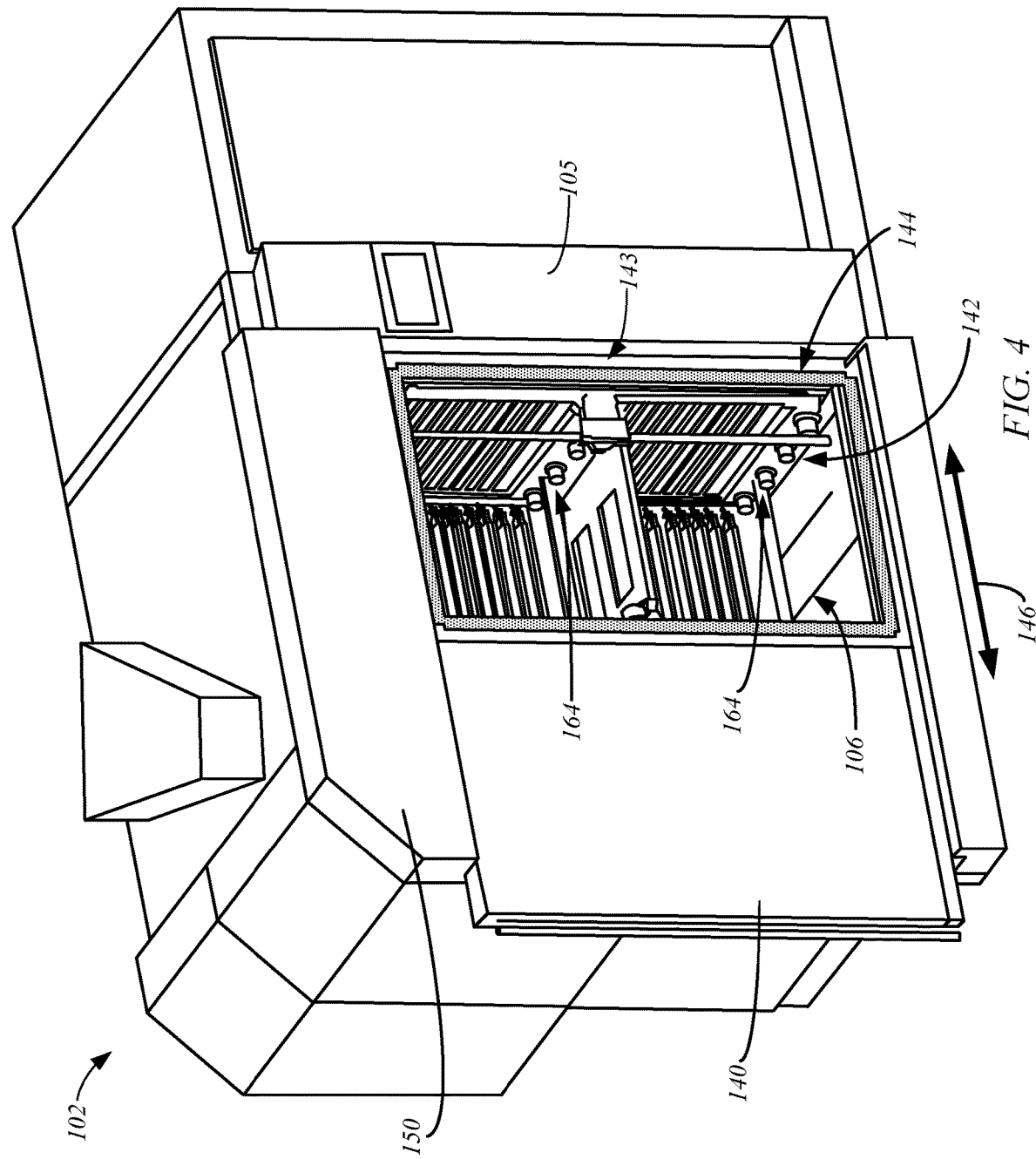
FIGS. 4 and 5 are isometric views of an example of a semiconductor burn-in oven having a door respectively in open and closed positions, in accordance with embodiments of the present disclosure.
Figure 5:
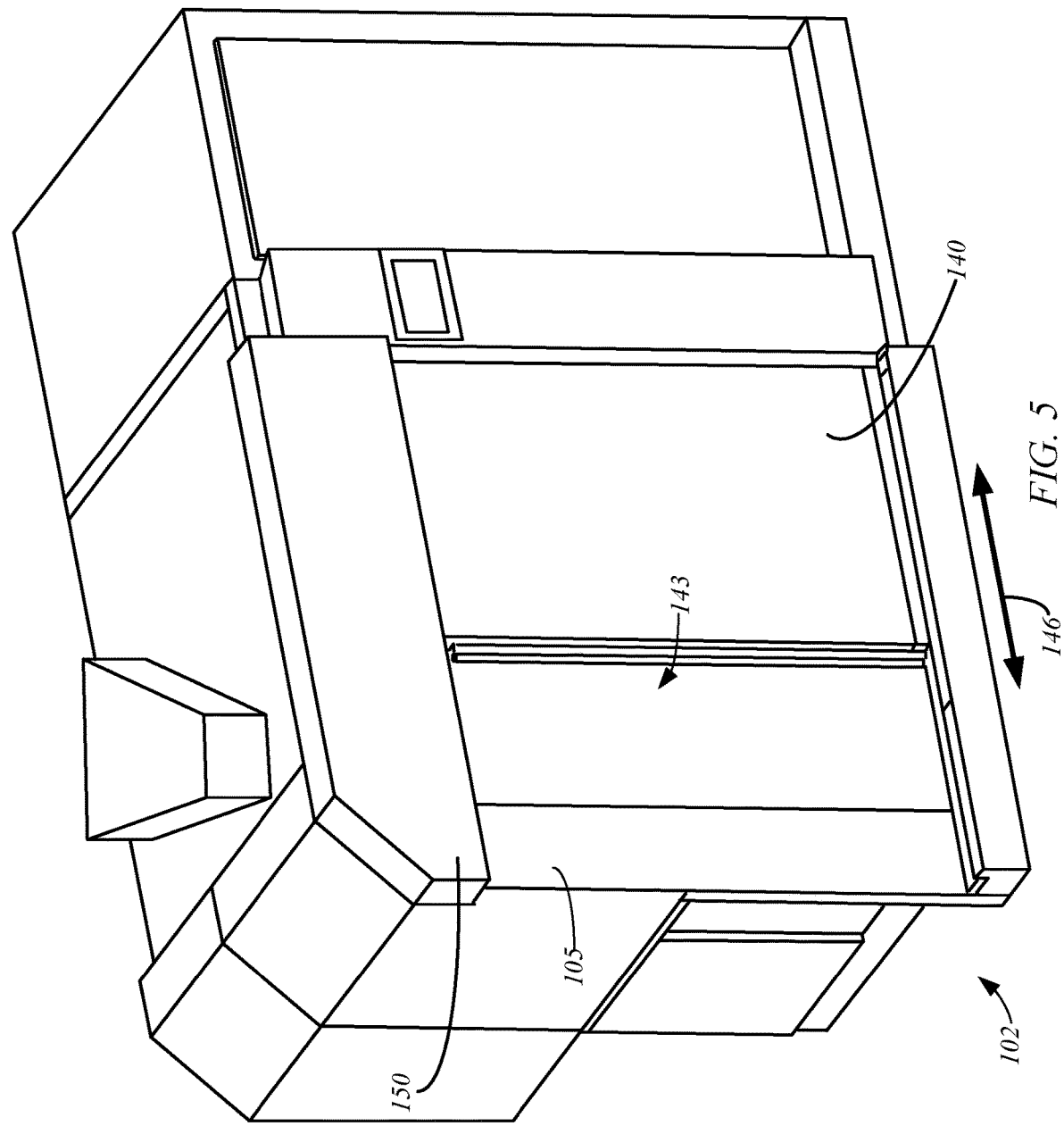

FIGS. 4 and 5 are isometric views of an example of a semiconductor burn-in oven 102 having a door 140 respectively in open and closed positions, in accordance with embodiments of the present disclosure. In the illustrated example, the door 140 is configured to slide along the axis 146 using the motorized carriage 150 between the open position (FIG. 4), in which the burn-in chamber 106 is accessible, and the closed position (FIG. 5), in which the chamber 106 is sealed. The carriage 150 may include limit switches that mark the end-of-travel limits for the door 140, an encoder for positioning the door at or between the open and closed positions, and other components for controlling the opening and closing of the door 140.

Embodiments of the present disclosure relate to a burn-in board seating assembly contained within the semiconductor burn-in oven 102 that is configured to seat electrical connectors of the burn-in boards 108 received within the chamber 106 to electrical connectors of the system electronics 110, to establish electrical connections between the system electronics 110 and the semi-conductor devices 104, such as between the testing circuitry 111, the power regulator 124, the remote diode temperature sensing circuit 122, the pin driver receiver circuitry 130, and/or other circuitry of the system electronics 110 to corresponding components of the devices 104, for example.

Figure 6:
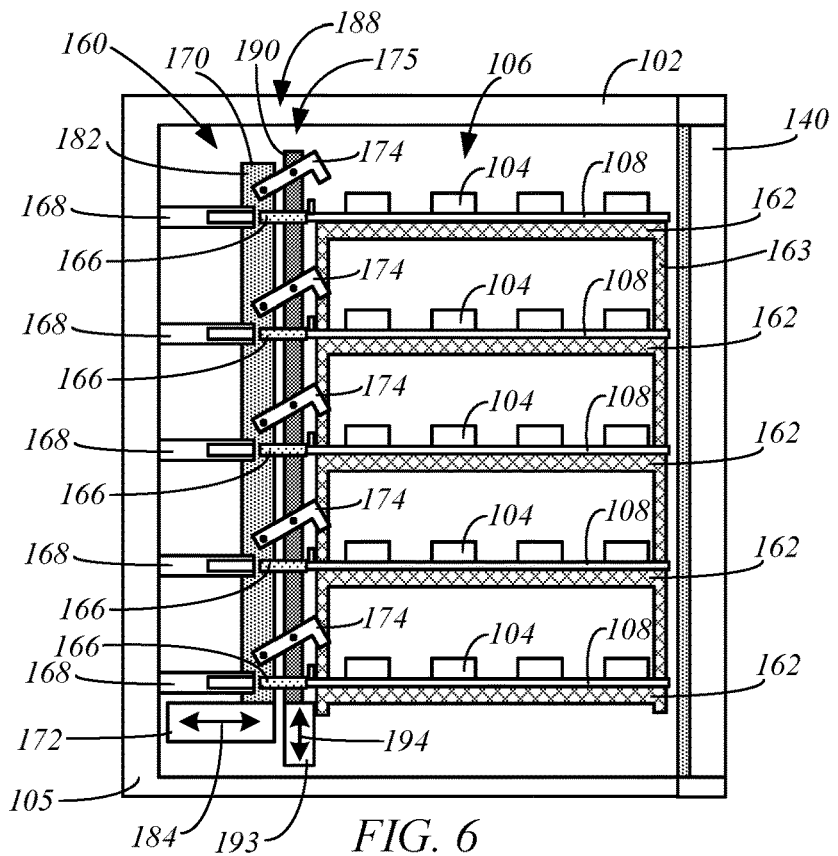
FIGS. 6-8 are simplified diagrams of a burn-in oven that includes an example of a burn-in board seating assembly, in accordance with embodiments of the present disclosure.
Figure 7:
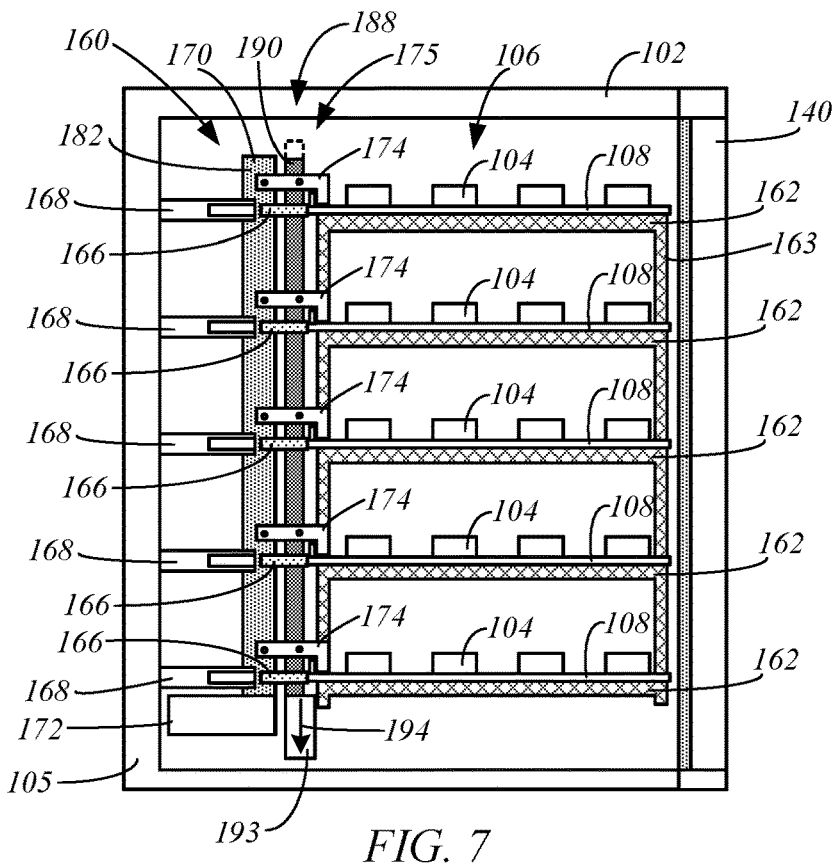
Figure 8:
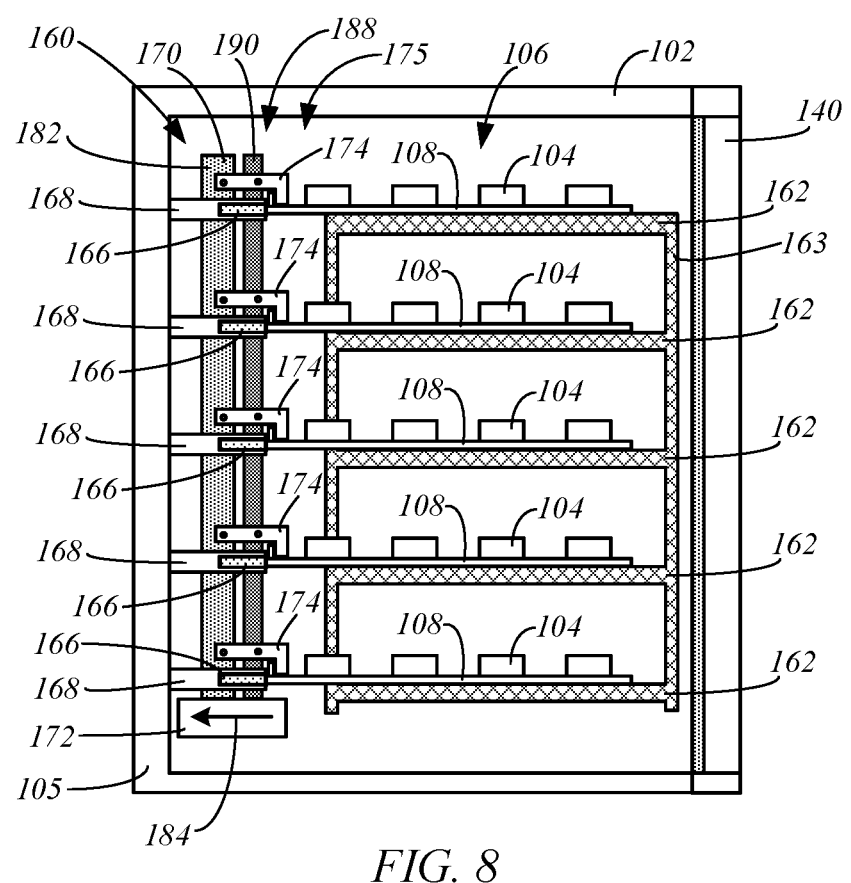

FIG. 6-8 are simplified diagrams of a burn-in oven 102 that includes an example of a burn-in board seating assembly 160, in accordance with embodiments of the present disclosure. A plurality of burn-in boards 108 may be supported on rails 162 within the chamber 106, as shown in FIG. 6. The rails 162 may be components of the oven 102, or components of a burn-in board rack 163 that is received within the chamber 106, such as shown in FIGS. 6-8.

Figure 9:
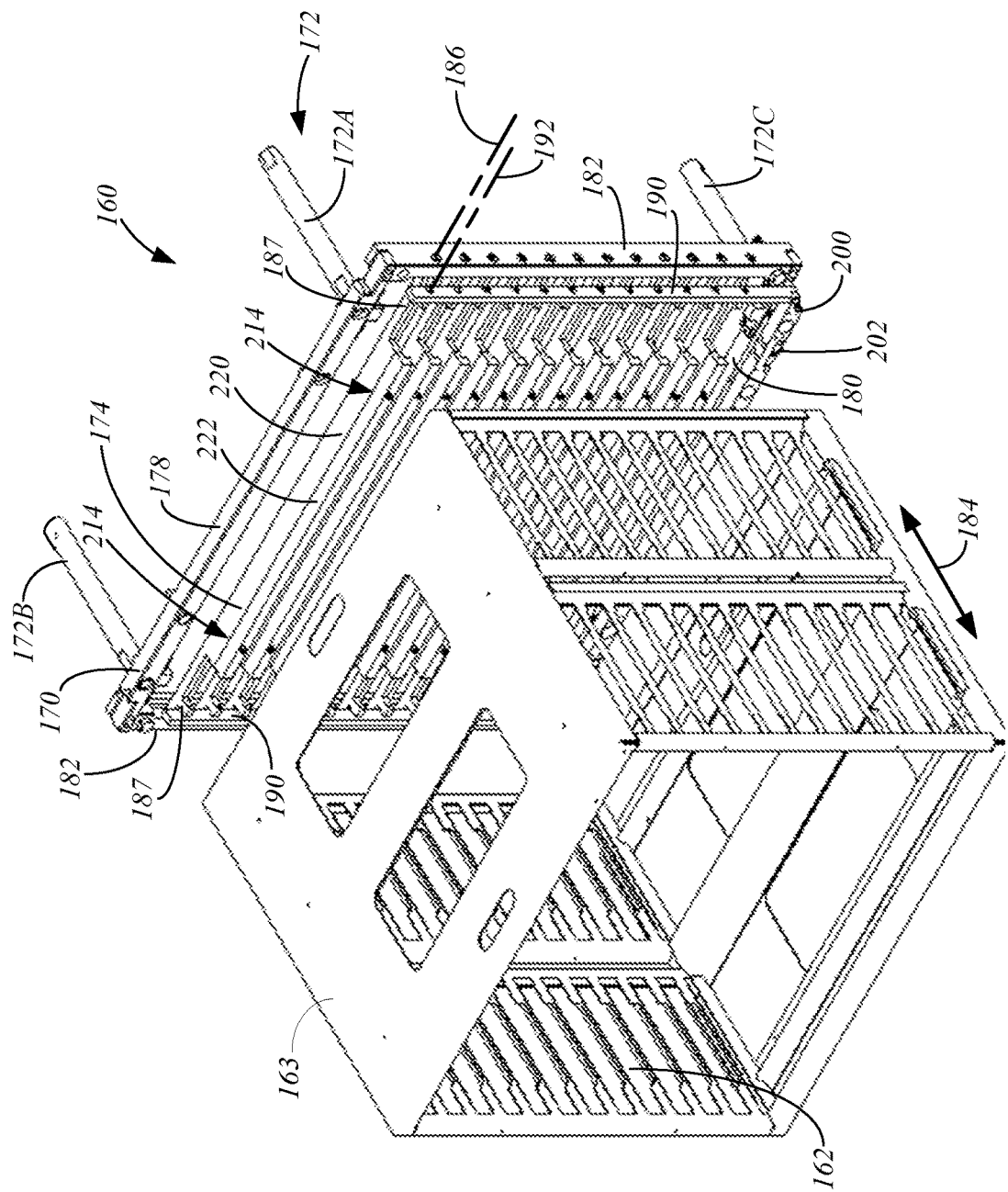
FIG. 9 is an isometric view of one example of a seating assembly in relation to a burn-in board rack, in accordance with embodiments of the present disclosure.

FIG. 9 is an isometric view of one example of a seating assembly 160 of the oven 102 in relation to an example of a burn-in board rack 163. The rack 163 supporting a plurality of the burn-in boards 108 may be installed into the chamber 106 (FIG. 6) through the opening 142 of the oven 102 by an operator, or an automated process (e.g., automated robot). Each rack 163 may support several (e.g., 10-15) burn-in boards 108. In some embodiments, the chamber 106 may be configured to accommodate two of the racks 163, such as the chamber 106 of the burn-in oven 102 shown in FIG. 4. The burn-in chamber 106 may include rollers 164 (FIG. 4) and other features for guiding the installation of each rack 163 within the chamber 106. The seating assembly 160 may be configured to operate with each of the boards 108 supported on the rack or racks 163.

With one or more burn-in boards 108 supported within the chamber 106 of the oven 102, such as on a rack 163 or on rails 162 of the oven 102, the burn-in board seating assembly 160 operates to slide each of the burn-in boards 108 relative to the chamber 106 and the housing 105 of the oven 102 and seat or join electrical connectors (board connectors) 166 of each of the boards 108 to the corresponding electrical connectors (circuit connectors) 168 of the system electronics 110. Each board connector 166 is configured to provide an electrical connection to components of the devices 104 and the board 108. The system electronics 110, such as the testing circuitry 111 (FIG. 2), can power and/or perform test operations on the devices 104 on each board 108 through the corresponding joined connectors 166 and 168.

In some embodiments, the burn-in board seating assembly 160 includes a main frame 170, one or more main frame actuators 172, hook members 174, and a hook driver 175, as shown in FIG. 6. A controller 176 (FIG. 1) representing one or more processors may be used to control the main frame actuator 172 and the hook driver 175, and perform other functions described herein in response to the execution of instructions stored in a suitable patent-eligible, non-transitory storage medium represented by memory 177 (FIG. 1).

Figure 10:
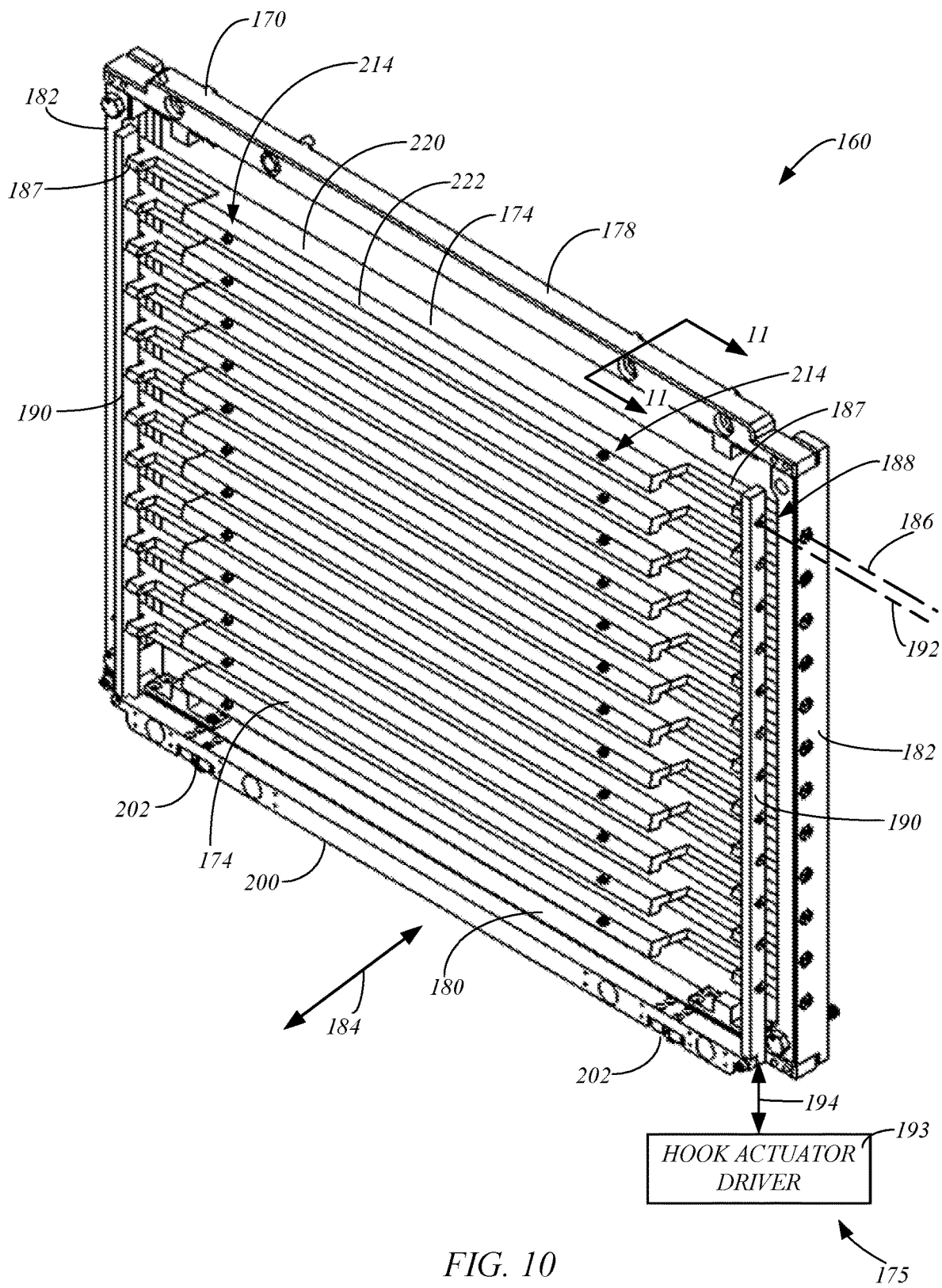
FIG. 10 is an isometric view of a front side of an example of a seating assembly, in accordance with embodiments of the present disclosure.
Figure 11:
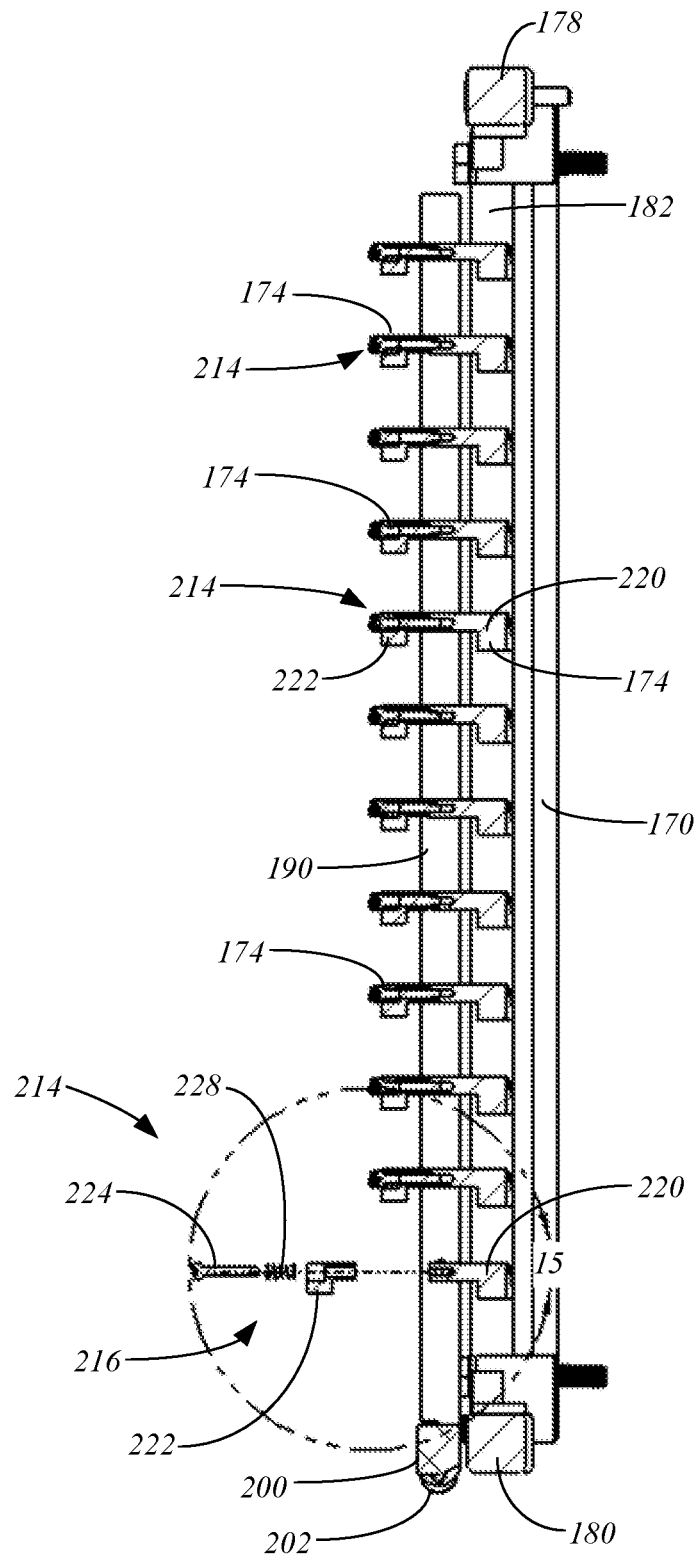
FIG. 11 is a side cross-sectional view of the seating assembly of FIG. 10 taken along line 11-11 with components of a seating control mechanism exploded, in accordance with embodiments of the present disclosure.
Figure 12:
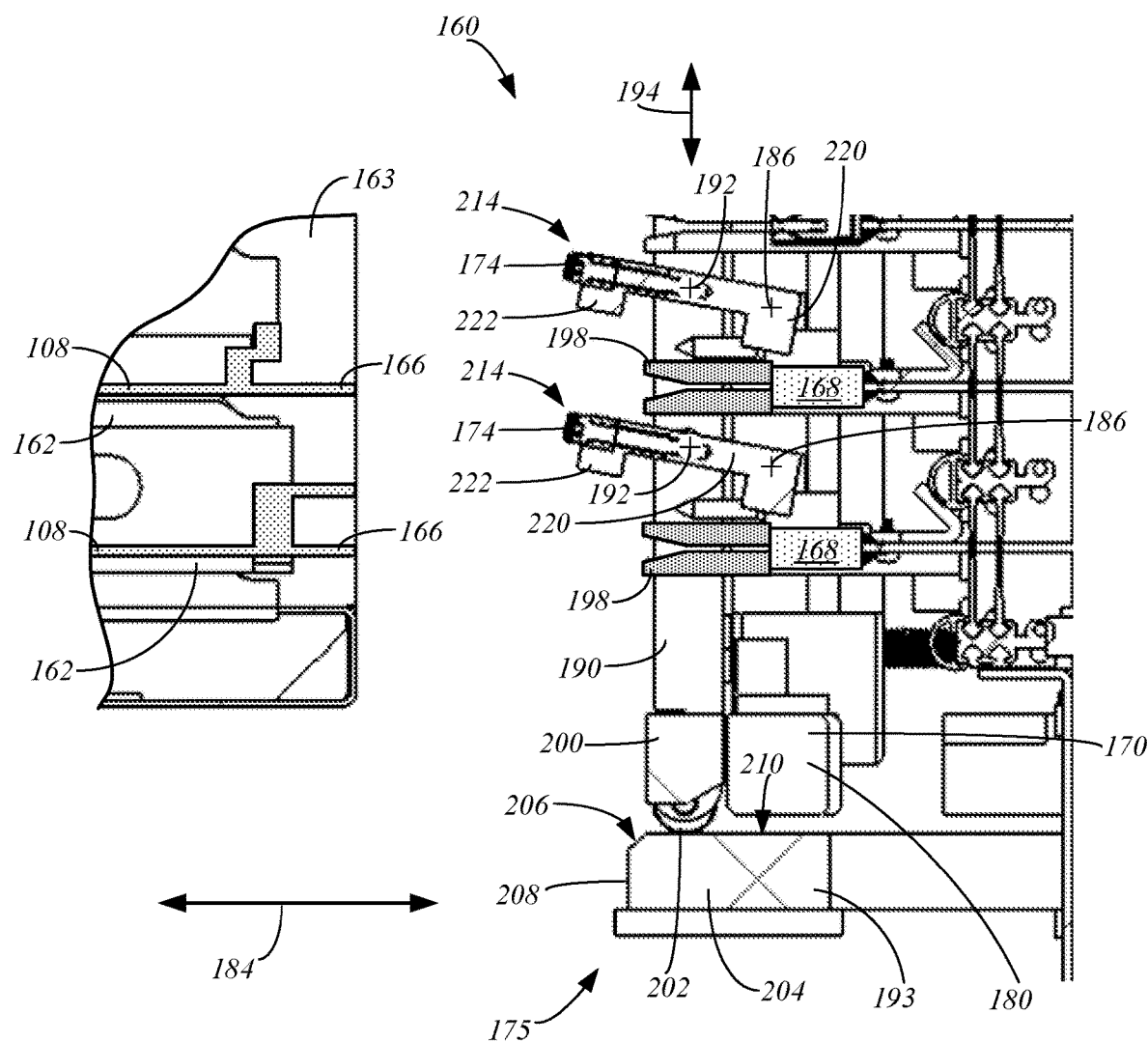
FIGS. 12 and 13, are simplified side views of a portion of a burn-in oven seating assembly in different states of operation, in accordance with embodiments of the present disclosure.
Figure 13:
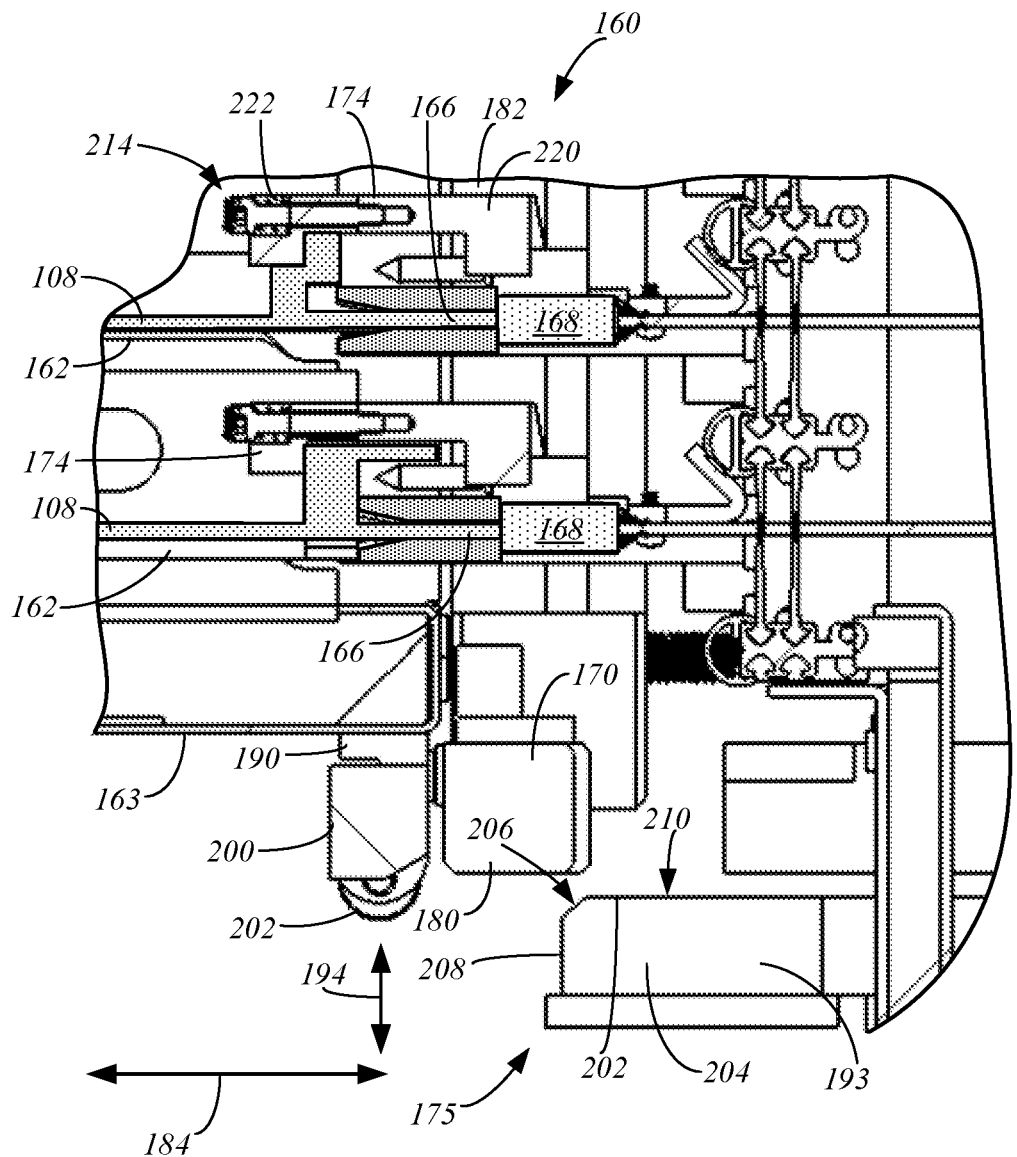

FIG. 10 is an isometric view of a front side of the seating assembly 160, in accordance with embodiments of the present disclosure, and FIG. 11 is a side cross-sectional view of the seating assembly 160 taken along line 11-11 of FIG. 10. In some embodiments, the main frame 170 includes a top member 178, a bottom member 180, and a pair of side members 182 extending between the top and bottom members 178 and 180, as best shown in FIG. 10. FIGS. 12 and 13, are simplified side views of a portion of a burn-in oven seating assembly 160 in different states of operation, in accordance with embodiments of the present disclosure.

The main frame actuator 172 is configured to move the main frame 170 relative to circuit connectors 168 of the system electronics 110, as well as the housing 105 of the oven 102 and/or the rack 163 (if present), along an axis 184, as generally shown in FIG. 6. The one or more main frame actuators 172 may include one or more pneumatic actuators, motorized mechanisms, and/or other actuators. In the example shown in FIG. 9, the main frame actuator 172 includes pneumatic actuators, such as a pair of actuators (172A and 172B) connected to the top member 178, and a pair of actuators (only actuator 172C shown) connected to the bottom member 180 of the main frame 170. Each of the pneumatic actuators 172 may include a conventional piston-cylinder actuator having a cylinder (housing) and a piston, where the piston may be driven relative to the cylinder along the axis 184. The cylinder of the actuator 172 may have a fixed position relative to the housing 105 of the oven 102, and the piston may be connected to the main frame 170. The piston is pneumatically driven within the cylinder to drive the attached main frame 170 along the axis 184 relative to the circuit connectors 168 of the system electronics 110 and the rack 163.

Each of the hook members 174 is pivotably connected to the main frame 170, such that they each pivot about a pivot axis 186 (FIG. 10) relative to the main frame 170. The axis 186 may be substantially perpendicular to the side members 182 and parallel to the top and bottom members 178 and 180 of the main frame 170. In one example, suitable pivotable connections join opposing ends 187 of each hook member 174 to the corresponding side member 182 of the main frame 170, such that the hook member 174 may rotate or pivot about the axis 186.

In one embodiment, the hook driver 175 includes a hook actuator 188 that is connected to the hook members 174. One example of the hook actuator 188 may include a pair of side bars 190 that extend along the side members 182 of the main frame 170, as shown in FIGS. 10 and 11. The opposing ends 187 of the hook members 174 pivotably connected to the side bars 190 such that they are configured to pivot or rotate about an axis 192, as indicated in FIG. 10. The axis 192 of each hook member 174 may be substantially parallel (+/−5 degrees) to the axis 186 formed by the connection between each hook member 174 and the side members 182 of the main frame 170, as indicated in FIG. 10.

The hook driver 175 may also include a hook actuator driver 193 that is configured to move the side bars 190 along an axis 194 (FIGS. 6 and 10) relative to the main frame 170, as well as the rack 163 (if present), the housing 105, and/or the circuit connectors 168 of the system electronics 110. In one embodiment, this movement of the side bars 190 along the axis 194 causes each of the hook members 174 to pivot about the axis 192 and 186 and move the hook members 174 between a receiving position (FIG. 6) and a latched position (FIGS. 7, 8 and 11).

Each of the hook members 174 may include a hooking or latching portion at a distal end that is configured to hook or latch a corresponding burn-in board 108. The latching portion of each hook member 174 may take on any suitable form, such as an L-shaped profile, as shown in FIGS. 6, 11 and 12.

During a seating operation, each of the hook members 174 are initially placed in the receiving position by the hook actuator driver 193, as the burn-in boards 108 are received within the chamber 106, such as when a rack 163 supporting the burn-in boards 108 is received within the chamber 106, as indicated in FIGS. 6 and 12. Once the burn-in boards 108 are received within the chamber 106, and possibly the door 140 moved to its closed position, the hook actuator driver 193 may move the side bars 190 along the axis 194 in the direction indicated in FIG. 7 to transition the hook members 174 to their latched positions, in which the latching portions hook or latch to a portion of the corresponding burn-in board 108. While in this latched position, the board connectors 166 of the burn-in boards 108 are not fully received by the connectors 168 of the system electronics 110. However, the board connectors 166 of each of the burn-in boards 108 may be partially received within the circuit connectors 168 of the system electronics 110, or partially received within guides 198 (FIG. 12) that assist in guiding the board connectors 166 of the burn-in boards 108 to the circuit connectors 168 of the system electronics 110.

With the burn-in boards 108 latched to the main frame 170 through the hook members 174, the main frame actuator 172 moves the main frame 170 from its forward (extended) position (FIGS. 6 and 7) along the axis 184 to a retracted position, thereby pulling the burn-in boards 108 from the rack 163 and seating the board connectors 166 of the burn-in boards 108 into the corresponding circuit connectors 168 of the system electronics 110, as shown in FIGS. 10 and 13. With the electrical connections established between the system electronics 110 and the devices 104 of each of the burn-in boards 108, a burn-in temperature stressing test may be performed on the devices 104 within the burn-in oven 102.

The hook actuator driver 193 that drives movement of the side bars 190 and the corresponding hook members 174 from the receiving position to the latched position may take on various forms. In one example, the hook actuator 188 includes a bottom bar 200 attached to the side bars 190, and a pair of rollers 202 supported by the bottom bar 200, as shown in FIGS. 10, 11, 12 and 13. The hook actuator driver 193 includes a ramp member 204 for each roller 202, such as shown in FIGS. 12 and 13. The ramp member 204 operates to drive the side bars 190 between their raised or receiving position (FIG. 12) to their lowered or latched position (FIG. 13).

In one embodiment, the ramp member 204 includes a ramp 206 that extends from a front surface 208 to a top surface 210. The ramp member 204 may be transitioned between a forward position (FIG. 12), in which the rollers 202 are supported on the top surface 210, to a retracted position (FIG. 13), in which the rollers 202 drop below the top surface 210 and may be displaced from the ramp member 204. This movement of the ramp member 204 may be driven by movement of the ramp member 204 along the axis 184 using a suitable actuator, such as a motorized drive screw, motorized cams, a pneumatic actuator, or another suitable actuator of the hook actuator driver 193 under the control of the controller 176.

When the ramp member 204 is in the forward position, the support of the rollers 202 on the corresponding top surface 210 positions the side bars 190 in their raised position, thereby placing the hook members 174 in the receiving position, as shown in FIG. 12. When the boards 108 are fully received within the chamber 106, the ramp member 204 is moved to the retracted position, which causes the side bars 190 to move to their lowered position, thereby placing the hook members 174 in their latched position and in engagement with the corresponding boards 108, as shown in FIG. 13. As the ramp member 204 is transitioned from the retracted position back to the forward position, such as after a testing operation has been performed on the devices 104 of the boards 108, the rollers 202 engage and roll up the ramp 206 of the corresponding ramp member 204 to the top surface 210, which drives the side bars 190 from the lowered position to the raised position. While the ramp member 204 is shown as being disengaged from the corresponding roller 202 when in the latched position (FIG. 13), it is understood that the ramp member 204 may include a support for supporting the roller 202 in the lower position.

During the seating or connecting of the board connectors 166 to the circuit connectors 168 of the system electronics 110 as the main frame 170 is transitioned from its forward position (FIGS. 6 and 7) to its retracted position (FIG. 8), it is important that the board connectors 166 and 168 are not damaged. In some embodiments, the seating assembly 160 includes seating control mechanisms that prevent the board connectors 166 and 168 from being driven into each other in a manner that could damage them.

Figure 14:
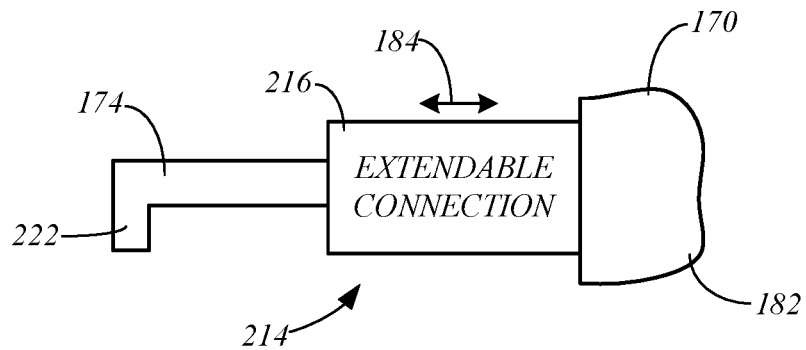
FIG. 14 is a simplified diagram of a seating control mechanism, in accordance with embodiments of the present disclosure.

FIG. 14 is a simplified diagram of a seating control mechanism 214, in accordance with embodiments of the present disclosure. In one embodiment, each seating control mechanism 214 is coupled between one of the hook members 174 and the main frame 170 (e.g., side member 182), as indicated in the simplified diagram of FIG. 14. The seating control mechanism 214 includes an extendable connection 216 that is configured to facilitate relative movement between at least a portion of the hook member 174 and the main frame 170 along the axis 184, as indicated in FIG. 14. Additionally, the extendable connection 216 operates to place a limit on the force that may be applied between the board connectors 166 of the corresponding board 108 and the circuit connectors 168 of the system electronics 110, as the main frame 170 is transitioned from its forward position to its retracted position. This ensures that the board connectors 166 of all of the boards 108 may be properly seated in the corresponding circuit connectors 168 of the system electronics 110 without damaging them.

As discussed above, during a seating operation, the hook members 174 are initially placed in their receiving positions, as shown in FIGS. 6 and 12. After the boards 108 are fully received within the chamber 106 of the oven 102, and the main frame 170 is in its forward position, the hook actuator driver 193 transitions the hook actuator 188 to move the hook members 174 from the receiving position to the latched position, as shown in FIGS. 7 and 13. The main frame 170 is then moved toward the retracted position by the one or more main frame actuators 172. During this movement of the main frame 170, the latching portions of the hook members 174 engage their corresponding boards 108 and pull the boards from the rack 163 (if present) toward the circuit connectors 168 of the system electronics 110, and the electrical connectors 166 of the boards 108 are received by the circuit connectors 168 of the system electronics 110, as shown in FIGS. 8 and 13. During this seating or connecting of the electrical connectors 166 of the boards 108 with the circuit connectors 168 of the system electronics 110, a force is applied between the connectors 166 and 168. If this force exceeds a bias force between the portion of one of the hook members 174 and the main frame 170 that is applied by the extendable connections 216 of the seating control mechanism 214, the hook member 174 will move along the axis 184 relative to the main frame 170 and prevent the corresponding electrical connectors 166 and 168 from being damaged by further movement of the main frame 170 relative to the circuit connectors 168.

Figure 15:
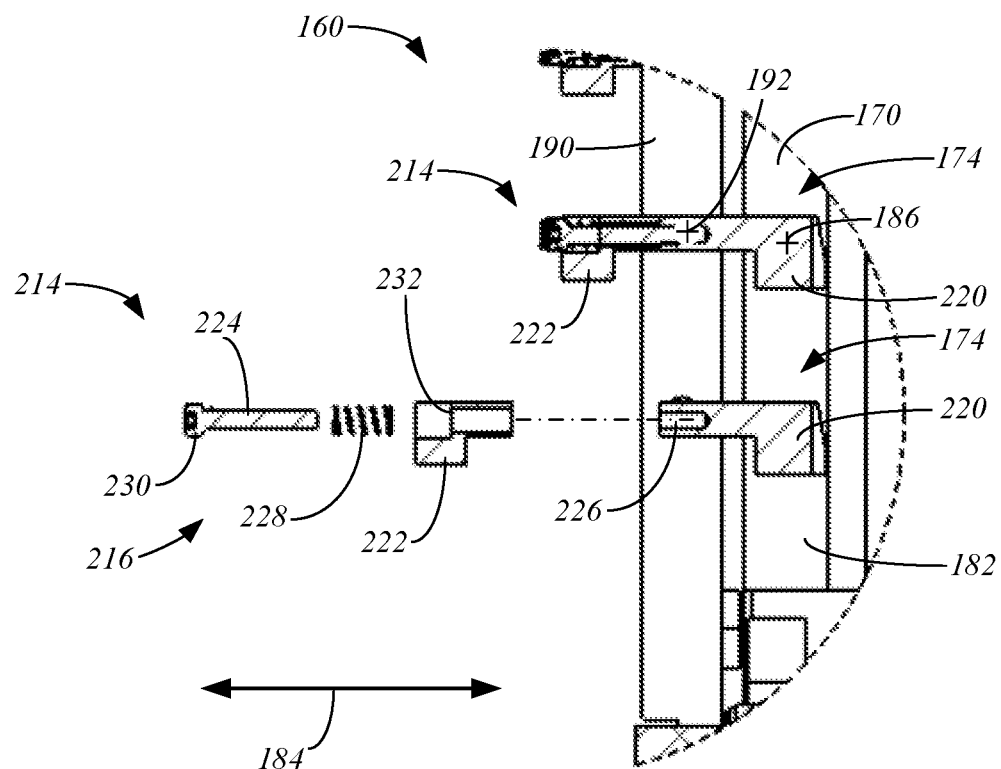
FIG. 15 is a magnified view of the portion of FIG. 11 within circle 15.

The seating control mechanism 214 may take on any suitable form. In one example, each seating control mechanism 214 operates to join separate parts of the hook member 174, such as a pivotable portion 220 and a latching portion 222, as indicated in FIG. 15, which is a magnified view of the portion of FIG. 14 within circle 15, using the extendable connection 214. The pivotable portion 220 may include the ends 187 that are coupled to the side bars 190 through the pivotable connection that defines the axis 192, about which the pivotable portion 220 can rotate, and the pivotable portion 220 may be coupled to the side members 182 of the main frame 170 through a pivotable connection that defines the axis 186, about which the pivotable portion 220 can rotate. The latching portion 222 corresponds to the portion of the hook member 174 that engages a received board 108 when the hook member 174 is in the latching position (FIGS. 8 and 13) and is used to pull the board 108 along the axis 184 when the main frame 170 is moved from the extended position to the retracted position.

In one example, the extendable connection 216 biases the latching portion 222 toward the pivotable portion 220. In one example, each extendable connection 216 is formed using a screw 224 that extends through the latching portion 220 and is received within a threaded bore 226 of the pivotable portion 222, as indicated in FIG. 15. A suitable biasing mechanism 228, such as a spring, may be positioned between a shoulder 230 of the screw 224 and shoulder 232 of the latching portion. The biasing mechanism 228 applies a bias force against the shoulders 230 and 232 to drive the latching portion 222 toward the pivotable portion 220, such as along the axis 184 when the hook member 174 is in the latching position, as indicated in FIG. 15. When the bias force is exceeded, such as during movement of the main frame 170 from the extended position to the retracted position and engagement between the electrical connectors 166 and 168, the latching portion 222 moves along the axis 184 relative to the pivotable portion 220 and the main frame 170. This prevents potentially damaging forces from being exerted on the electrical connectors 166 and 168 during the seating of the connectors 166 and 168.

In some embodiments, each seating control mechanism 214 includes at least two extendable connections 216 that are displaced from each other across the width of the hook member 174 and along the axes 186 and 192, such as shown in FIG. 10. This allows the hook member 174 to flex within a plane extending substantially parallel to the board 108 and the axis 184, and a seating operation when the leading edge of the board 108 is not parallel to the axis 186 or 192.

Figure 16:
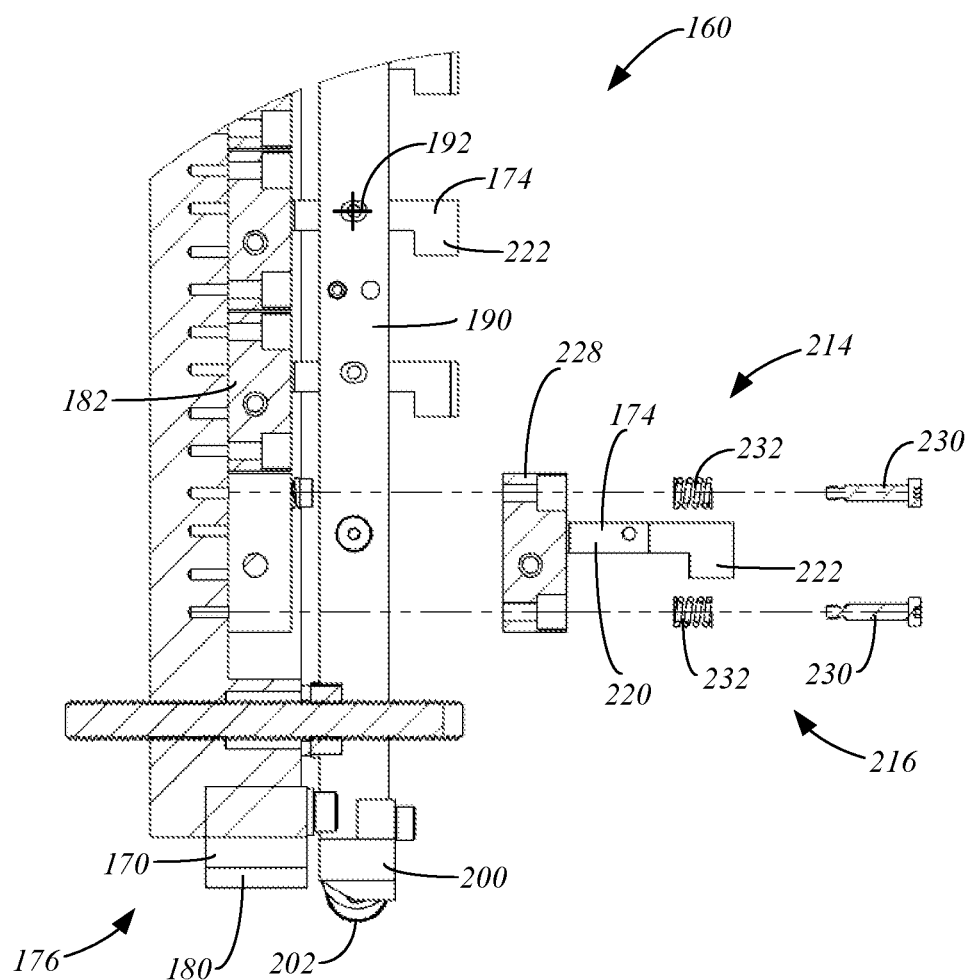
FIG. 16 is a partial side view of a seating assembly with components of one of a seating control mechanism exploded, in accordance with embodiments of the present disclosure.

Another example of a seating control mechanism 214 is shown in FIG. 16, which is a partial side view of a seating assembly 160 with components of one of the seating control mechanisms 214 exploded, in accordance with embodiments of the present disclosure. In this example, each end 187 of the hook members 174 is attached to its corresponding side member 182 of the main frame 170 through an extendable connection 216, and each hook member 174 includes a pivotable portion 220 and the latching portion 222 that are integrated into a single component. Each extendable connection 216 may include a main body 228 that is attached to one of the side members 182 of the main frame 170. The main body 228 includes a pivotable connection to the corresponding end 187 of the hook member 174, which allows the hook member 174 to pivot about the axis 192 (FIG. 12) relative to the main body 228 and the side member 182. The main body 228 may be attached to the side member 182 using a pair of bolts 230 that extend through the main body 228 and attach to the side member 182. A biasing mechanism 232, such as a spring, may be positioned within a gap formed between the head of each bolt 230 and the main body 228. The biasing mechanism 232 biases the main body 228 toward the side member 182 with a bias force, but allows the main body 228 to move away from the side member 182 when the bias force is overcome. The bias force is set to prevent damaging the electrical connectors 166 and 168, as discussed above.

Additional embodiments are directed to methods of receiving a plurality of burn-in boards 108 within a semiconductor burn-in oven 102 formed in accordance with one or more embodiments described herein. For example, the burn-in oven 102 may include a housing 105 having a burn-in chamber 106, a heating device 116 that is configured to heat the chamber 106. The oven 102 may include semiconductor electronics 110, such as testing circuitry 111, that is configured to power semiconductor device 104 through circuit connectors 168 of burn-in boards 108 that are supported within the chamber 106, such as on a rack 163. The burn-in oven 102 may include a seating assembly 160 that includes a main frame 170, a main frame actuator 172, a plurality of hook members 174, and a hook driver 175. The main frame actuator 172 is connected to the main frame 170 and is configured to drive movement of the main frame 170 along an axis 184 relative to the circuit connectors 168 and the chamber 106 between an extended position and a retracted position, such as discussed above with reference to FIGS. 6-8. The hook members 174 are connected to the main frame 170, and each hook member 174 is configured rotate or pivot about a pivot axis 186 that is substantially perpendicular to the axis 184. The hook driver 175 is configured to pivot the hook members 174 about their pivot axes 186 between a receiving position and a latching position, such as described above with reference to FIGS. 6-8.

Figure 17:
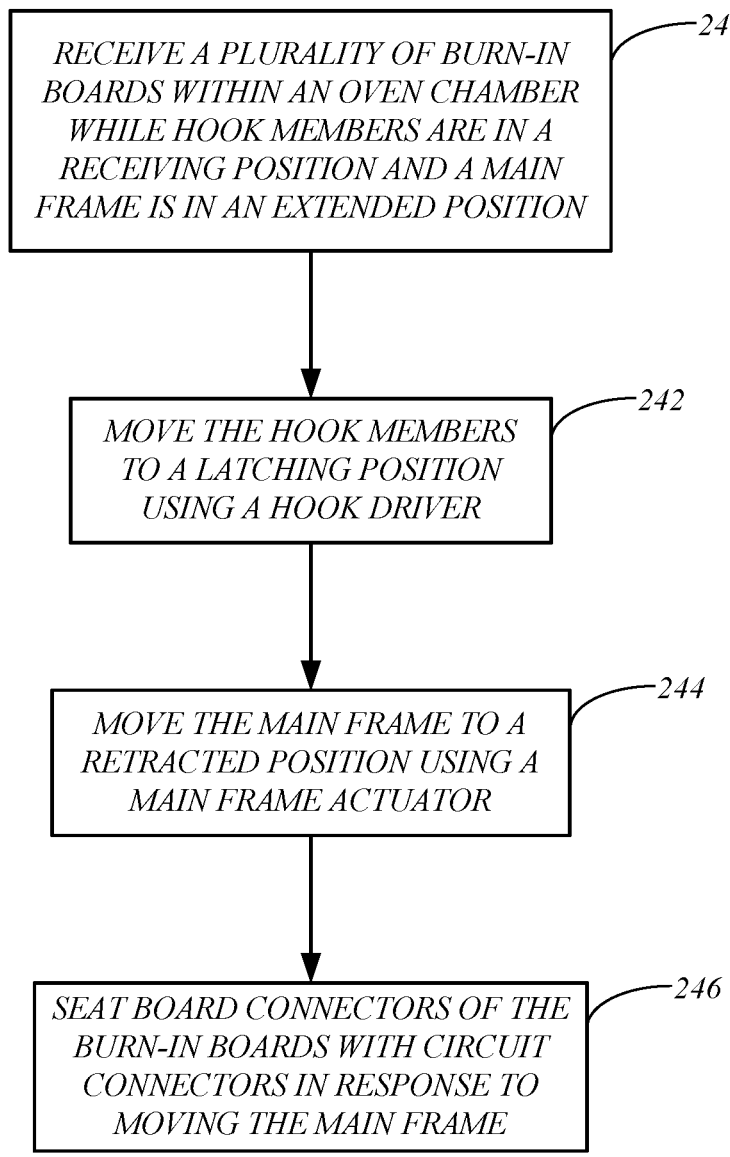
FIG. 17 is a flowchart illustrating an example of a method of receiving a plurality of burn-in boards within a semiconductor burn-in oven, in accordance with embodiments of the present disclosure.

FIG. 17 is a flowchart illustrating one embodiment of the method. At 240 of the method, a plurality of burn-in boards 108 are received within the chamber 106 while the hook members 174 are in the receiving position and the main frame 170 is in the extended position, such as shown in FIG. 6. The hook members 174 are moved to their latching positions (FIG. 7) using the hook driver 175, at 242. At 244 of the method, the main frame 170 is moved to the retracted position using the main frame actuator 172, such as indicated in FIG. 8. At 246, the board connectors 166 of the burn-in boards 108 are seated with the circuit connectors 168 in response to the moving step 244, as shown in FIGS. 8 and 13. This allows the semiconductors devices 104 of the burn-in boards 108 to be powered and tested by the testing circuitry 111. In some embodiments of the method, a test is performed on the semiconductor devices 104 using the testing circuitry 111 after the seating step 246.

Although the embodiments of the present disclosure have been described with reference to preferred embodiments, workers skilled in the art will recognize that changes may be made in form and detail without departing from the spirit and scope of the present disclosure.

What is claimed is:

1. A semiconductor burn-in oven comprising:
  a housing including a chamber;
  a heating device configured to heat the chamber;
  testing circuitry configured to power semiconductor devices of burn-in boards supported within the chamber through circuit connectors; and
  a seating assembly comprising:
    a main frame;
    a main frame actuator connected to the main frame and configured to drive movement of the main frame along a first axis relative to the circuit connectors and the chamber between an extended position and a retracted position;
    a plurality of hook members connected to the main frame, each hook member having a pivot axis that is substantially perpendicular to the first axis; and
    a hook driver configured to pivot each hook member about its pivot axis between a receiving position and a latching position,
  wherein board connectors of burn-in boards supported within the chamber are driven to seat with the circuit connectors when the burn-in boards are latched by the hook members in their latching position and the main frame is moved from the extended position to the retracted position.

2. The semiconductor burn-in oven of claim 1, wherein the hook driver comprises:
  a hook actuator connected to the plurality of hook members; and
  a hook actuator driver configured to drive movement of the hook actuator along a second axis that is substantially perpendicular to the first and pivot axes, wherein each of the hook members pivots about their pivot axis in response to the movement of the hook actuator along the second axis.

3. The semiconductor burn-in oven of claim 2, wherein each hook member comprises a first pivotable connection between the hook member and the hook actuator, and a second pivotable connection between the hook member and a side member of the main frame that defines the pivot axis.

4. The semiconductor burn-in oven of claim 3, wherein the hook actuator driver is configured to drive the hook actuator between raised and lowered positions along the second axis that respectively correspond to the receiving and latching positions of the hook members.

5. The semiconductor burn-in oven of claim 4, wherein the hook actuator driver moves along the first axis relative to the main frame between an extended position, which places the hook actuator driver in the raised position, and a retracted position, which places the hook actuator driver in the lowered position.

6. The semiconductor burn-in oven of claim 1, wherein the seating assembly includes a plurality of seating control mechanisms, each coupled between one of the hook members and the main frame, and configured to facilitate relative movement between at least a portion of the hook member and the main frame along the first axis.

7. The semiconductor burn-in oven of claim 6, wherein each hook member includes:
  a pivotable portion attached to the side members; and
  a latching portion attached to the pivotable portion through one of the seating control mechanisms.

8. The semiconductor burn-in oven of claim 7, wherein each seating control mechanism comprises at least one spring configured to bias each latching portion toward the corresponding pivotable portion, the at least one spring facilitating movement of the latching portion along the first axis relative to the corresponding pivotable portion and the main frame.

9. The semiconductor burn-in oven of claim 1, wherein the main frame actuator comprises a plurality of pneumatic actuators configured to drive movement of the main frame between the extended and retracted positions.

10. The semiconductor burn-in oven of claim 1, wherein:
  the housing includes an opening to the chamber;
  the semiconductor burn-in oven includes a door having an open position, in which the burn-in chamber is accessible through the opening, and a closed position, in which the door covers the opening; and
  the seating assembly is located at a rear end of the chamber that is opposite the opening.

11. The semiconductor burn-in oven of claim 1, further comprising a rack configured to support a plurality of burn-in boards, the rack removably received within the chamber through the opening.

12. The semiconductor burn-in oven of claim 1, wherein:
the semiconductor burn-in oven comprises:
a controller including one or more processors; and
instructions stored in a non-transitory computer storage medium;
the controller performs a burn-in board seating operation in response to executing the instructions comprising:
moving the hook members from their receiving positions to their latching positions using the hook driver; and
moving the main frame from the extended position to the retracted position using the main frame actuator;
during moving the main frame each hook member engages a portion of a burn-in board supported within the chamber and pulls the burn-in board along the first axis relative to the circuit connectors; and
board connectors of each burn-in board seat with one of the circuit connectors when the main frame reaches the retracted position.

13. A method of receiving a plurality of burn-in boards within a semiconductor burn-in oven, which comprises:
a housing including a chamber;
a heating device configured to heat the chamber;
testing circuitry configured to power semiconductor devices of burn-in boards supported within the chamber through circuit connectors; and
a seating assembly comprising:
a main frame;
a main frame actuator connected to the main frame and configured to drive movement of the main frame along a first axis relative to the circuit connectors and the chamber between an extended position and a retracted position;
a plurality of hook members connected to the main frame, each hook member having a pivot axis that is substantially perpendicular to the first axis; and
a hook driver configured to pivot each hook member about its pivot axis between a receiving position and a latching position,
the method comprising:
receiving a plurality of burn-in boards within the chamber while the hook members are in the receiving position and the main frame is in the extended position;
moving the hook members to the latching position using the hook driver;
moving the main frame to the retracted position using the main frame actuator; and
seating board connectors of the burn-in boards with the circuit connectors in response to moving the main frame, wherein semiconductor devices of the burn-in boards are powered by the testing circuitry.

14. The method of claim 13, wherein:
the hook driver comprises:
a hook actuator connected to the plurality of hook members; and
a hook actuator driver configured to drive movement of the hook actuator along a second axis that is substantially perpendicular to the first and pivot axes; and
moving the hook members to the latching position comprises moving the hook actuator along the second axis using the hook actuator driver.

15. The method of claim 14, wherein moving the hook members to the latching position comprises moving the hook actuator driver along the first axis relative to the main frame from an extended position to a retracted position.

16. The method of claim 13, wherein:
the seating assembly includes a plurality of seating control mechanisms, each coupled between one of the hook members and the main frame, and configured to facilitate relative movement between at least a portion of the hook member and the main frame along the first axis; and
the method comprises moving one or more portions of the hook members relative to the main frame along the first axis using the seating control mechanisms during moving the main frame to the retracted position.

17. The method of claim 13, wherein:
each hook member includes:
a pivotable portion pivotably attached to the side members; and
a latching portion attached to the pivotable portion through one of the seating control mechanisms; and
each seating control mechanism comprises at least one spring configured to bias each latching portion toward the corresponding pivotable portion, the at least one spring facilitating movement of the latching portion along the first axis relative to the corresponding pivotable portion and the main frame during moving the main frame to the retracted position.

18. A semiconductor burn-in oven comprising:
a housing including a chamber;
a heating device configured to heat the chamber;
testing circuitry configured to power semiconductor devices of burn-in boards supported within the chamber through circuit connectors; and
a seating assembly comprising:
a main frame having a pair of side members;
a main frame actuator connected to the main frame and configured to drive movement of the main frame along a first axis relative to the circuit connectors and the chamber between an extended position and a retracted position;
a plurality of hook members connected to the side members of the main frame, each hook member having a pivot axis that is substantially perpendicular to the first axis; and
a hook actuator connected to the plurality of hook members, wherein each hook member comprises a first pivotable connection between the hook member and the hook actuator, and a second pivotable connection between the hook member and each side member of the main frame that defines the pivot axis; and
a hook actuator driver configured to drive movement of the hook actuator along a second axis that is substantially perpendicular to the first and pivot axes, wherein each of the hook members pivots about its pivot axis between a receiving position and a latching position in response to the movement of the hook actuator along the second axis,
wherein board connectors of burn-in boards supported within the chamber are driven to seat with the circuit connectors when the burn-in boards are latched by the hook members in their latching position and the main frame is moved from the extended position to the retracted position.

19. The semiconductor burn-in oven of claim 18, wherein the hook actuator driver moves along the first axis relative to the main frame between an extended position, which places the hook actuator in a raised position and the hook members in the receiving position, and a retracted position, which places the hook actuator in a lowered position and the hook members in the latching position.

20. The semiconductor burn-in oven of claim 18, wherein the seating assembly includes a plurality of seating control mechanisms, each coupled between one of the hook members and the main frame, and configured to facilitate relative movement between at least a portion of the hook member and the main frame along the first axis.

* * * * *